(12) United States Patent
Li

(10) Patent No.: US 12,426,498 B2
(45) Date of Patent: Sep. 23, 2025

(54) ELECTRON BARRIER FILM, QUANTUM DOT LIGHT-EMITTING DIODE AND PREPARATION METHOD THEREOF

(71) Applicant: TCL TECHNOLOGY GROUP CORPORATION, Guangdong (CN)

(72) Inventor: Xue Li, Guangdong (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 594 days.

(21) Appl. No.: 17/851,785

(22) Filed: Jun. 28, 2022

(65) Prior Publication Data

US 2022/0328776 A1    Oct. 13, 2022

Related U.S. Application Data

(63) Continuation of application No. PCT/CN2020/138653, filed on Dec. 23, 2020.

(30) Foreign Application Priority Data

Dec. 28, 2019   (CN) .......................... 201911384428.X

(51) Int. Cl.
*H01L 51/00*    (2006.01)
*H10K 50/115*   (2023.01)
(Continued)

(52) U.S. Cl.
CPC ............ *H10K 85/40* (2023.02); *H10K 50/115* (2023.02); *H10K 50/18* (2023.02); *H10K 71/00* (2023.02);
(Continued)

(58) Field of Classification Search
CPC ...... H10K 85/40; H10K 71/00; H10K 50/115; H10K 50/18; H10K 2102/331
See application file for complete search history.

(56) References Cited

U.S. PATENT DOCUMENTS

| 5,336,577 A  | 8/1994 | Spiewak et al. |
| 7,727,688 B2 | 6/2010 | Yagi |

(Continued)

FOREIGN PATENT DOCUMENTS

| CN | 101078893 A | 11/2007 |
| CN | 103904178 A | 7/2014 |

(Continued)

OTHER PUBLICATIONS

International Search Report for International Application No. PCT/CN2020/138653; Date of Completion: Mar. 11, 2021; Date of Mailing:: Mar. 23, 2021; 4 Pages.

(Continued)

*Primary Examiner* — Dale E Page
*Assistant Examiner* — Colleen E Snow

(57) ABSTRACT

An electron barrier film for a quantum dot light-emitting diode, the electron barrier film includes: a compound with a general formula $R^1$—$Si(OR^2)_3$; or a raw material for forming the electron barrier film includes a compound with the general formula $R^1$—$Si(OR^2)_3$ one in a group. Not only can a rate of injecting electrons into the luminescent layer be adjusted, so that the number of electron holes in the quantum dot luminescent layer can be equal to the number of electrons in the quantum dot luminescent layer, and a recombination efficiency of the electrons and the electron holes in the luminescent layer is improved, a better interface modification effect can also be achieved, and a surface roughness of the quantum dot luminescent layer is reduced, so that an overall performance of the quantum dot light-emitting diode is more stable.

14 Claims, 3 Drawing Sheets

(51) Int. Cl.
   *H10K 50/18*    (2023.01)
   *H10K 71/00*    (2023.01)
   *H10K 85/00*    (2023.01)
   *H10K 85/40*    (2023.01)
   *H10K 71/40*    (2023.01)
   *H10K 102/00*   (2023.01)

(52) U.S. Cl.
   CPC .............. *H10K 85/00* (2023.02); *H10K 71/40* (2023.02); *H10K 2102/331* (2023.02)

(56) References Cited

U.S. PATENT DOCUMENTS

| | | | |
|---|---|---|---|
| 9,865,829 | B2 | 1/2018 | Tada et al. |
| 10,340,461 | B2 | 7/2019 | Oshima et al. |
| 10,629,836 | B2 | 4/2020 | Kim et al. |
| 11,028,277 | B2 | 6/2021 | Oshima et al. |
| 2014/0054442 | A1 | 2/2014 | Huang et al. |
| 2015/0263298 | A1 | 9/2015 | Takada |
| 2019/0273216 | A1 | 9/2019 | Suruga et al. |
| 2020/0388762 | A1 | 12/2020 | Sugawara et al. |
| 2020/0411766 | A1 | 12/2020 | Sugawara et al. |
| 2021/0098726 | A1* | 4/2021 | Zhang .................. H10K 50/115 |
| 2021/0359241 | A1 | 11/2021 | Zhang et al. |

FOREIGN PATENT DOCUMENTS

| | | |
|---|---|---|
| CN | 103988329 A | 8/2014 |
| CN | 106566318 A | 4/2017 |
| CN | 107408633 A | 11/2017 |
| CN | 108075042 A | 5/2018 |
| CN | 108767129 A | 11/2018 |
| CN | 108807720 A | 11/2018 |
| CN | 108886099 A | 11/2018 |
| CN | 110088926 A | 8/2019 |
| WO | 2018009712 A2 | 1/2018 |
| WO | 2019116977 A1 | 6/2019 |
| WO | 2019176662 A1 | 9/2019 |

OTHER PUBLICATIONS

Translation of International Search Report for International Application No. PCT/CN2020/138653; Date of Completion: Mar. 11, 2021; Date of Mailing:: Mar. 23, 2021; 3 Pages.

Written Opinion for International Application No. PCT/CN2020/138653; Date of Completion: Mar. 17, 2021; Date of Mailing:: Mar. 23, 2021; 4 Pages.

* cited by examiner

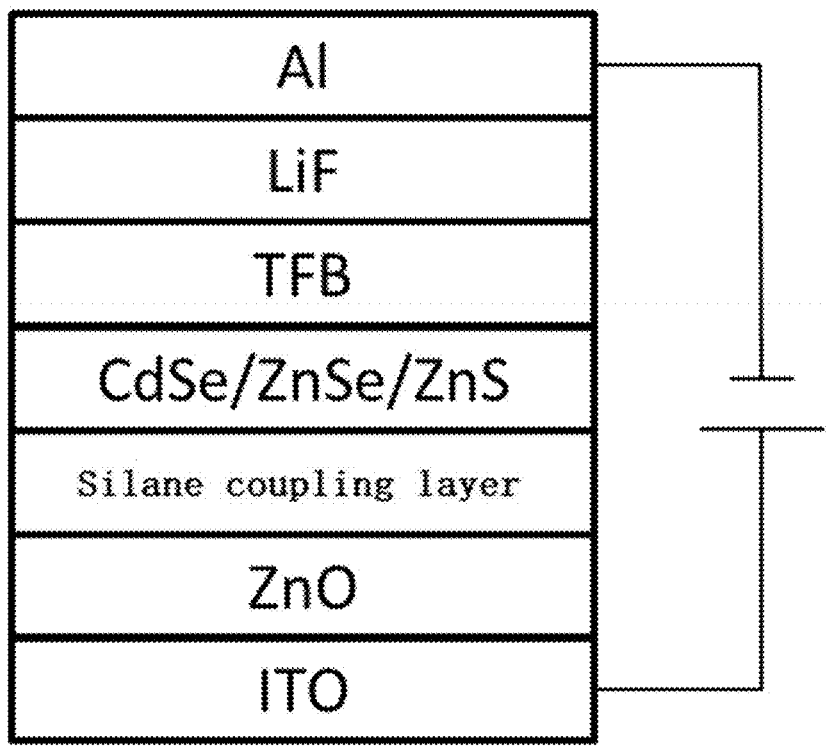

FIG. 2

Deposit a compound with a general formula $R^1$-Si $(OR^2)_3$ between a quantum dot luminescent layer and a cathode to form an electron barrier film; where $R^2$ is selected from one in a group consisting of H, $CH_3$, and $C_2H_5$; $R^1$ is selected from $(CH_2)_nX$, n is an integer between 3 and 6; X is selected from one in a group consisting of -P(OR3)2, -P(R3)2, -SH, -NH2 and -COOH; $R^3$ is $(CH_2)_mCH_3$, m is an integer between 1 and 7

Deposit a compound with a general formula $R^1\text{-Si }(OR^2)_3$ between a quantum dot luminescent layer and an anode to form an electron barrier film; where $R^2$ is selected from one in a group consisting of H, $CH_3$, and $C_2H_5$; $R^1$ is selected from $(CH_2)_nX$, n is an integer between 3 and 6; X is selected from one in a group consisting of -P(OR3)2, -P(R3)2, -SH, -NH2 and -COOH; $R^3$ is $(CH_2)_mCH_3$, m is an integer between 1 and 7 — E10

FIG. 4

ELECTRON BARRIER FILM, QUANTUM DOT LIGHT-EMITTING DIODE AND PREPARATION METHOD THEREOF

CROSS REFERENCE TO RELATED APPLICATION

This application is a continuation application of PCT International application No. PCT/CN2020/138653, filed on Dec. 23, 2020, which claims priority to Chinese patent application No. 201911384428.X filed on Dec. 28, 2019 and entitled "electron barrier film, quantum dot light-emitting diode and preparation method thereof", the entire contents each of which are incorporated herein by reference thereto.

TECHNICAL FIELD

The present application relates to technologies of quantum dots, and particularly, to an electron barrier film, a quantum dot light-emitting diode and a method for preparing quantum dot light-emitting diode.

DESCRIPTION OF RELATED ART

In recent years, since a quantum dot has the advantages of adjustable wavelength of emitted light, narrow peak width, high luminous efficiency, long service life, high thermal stability, excellent soluble processability due to its remarkable quantum confinement effect, so that the quantum dot has a wide application prospects in the fields such as novel display and illumination, solar cells, biomarkers, and the like. Quantum dot luminescent materials play an important role in the fields of LED (Light Emitting Diode) illumination, liquid crystal display, etc., the replacement of traditional fluorescent powder with the quantum dot effectively improves color gamut of LED (Light Emitting Diode) and liquid crystal displaying. Recently, QLED (Quantum Dot Light Emitting Diode) which takes the luminescent material as the luminescent layer has a wide application prospect in the fields such as solid-state illumination, panel display, and has drawn wide attentions from academic community and industrial community.

The QLED is performed by converging electrons and electron holes on the two sides in a quantum dot layer to form exciton, and thereby generates recombination luminescence. Under the action of electric field, electrons in a cathode and the electron holes in an anode will move towards a luminescent layer of a device (i.e., QLED) under driving of external driving voltage, a hole injection layer, a hole transport layer, an electron injection layer, and an electron transport layer are arranged on two sides of the quantum dot luminescent layer respectively to facilitate injection and migration of carriers in the moving process towards the luminescent layer of the device. In this situation, the electrons and the electron holes need to overcome an energy level barrier between the cathode and the electron injection layer and an energy level barrier between the anode and the hole injection layer first, and then move towards an electron transmit layer and a hole transmit layer of the device through the electron injection layer and the hole injection layer, the electrons and the electron holes will move to an interface of the luminescent layer of the device through the electron injection layer and the hole injection layer respectively, and are combined into excitons to emit light in the quantum dot luminescent layer.

However, due to the fact that a hole mobility is relatively lower than an electron mobility currently, an inconsistency between the number of electrons and the number of electron holes in the quantum dot luminescent layer is caused, and the excitons are prone to be recombined in the hole transport layer, rather than being recombined within the desired quantum dot luminescent layer, thereby affecting a luminescent property of the device.

SUMMARY

One of the objectives of the embodiments of the present application is to provide an electron barrier film for a quantum dot light-emitting diode, a quantum dot light-emitting diode and a preparation method thereof, which aim to solve a problem that an inconsistency between the number of electrons and the number of electron holes in the quantum dot luminescent layer is caused due to the fact that the hole mobility is relatively lower than the electron mobility, so that the excitons are prone to be recombined in the hole transport layer, rather than being recombined in the desired quantum dot luminescent layer.

In order to achieve this objective, the technical solutions disclosed by the present application are as follows:

In the first aspect, an electron barrier film for a quantum dot light-emitting diode is provided, the electron barrier film includes a compound with a general formula $R^1$—$Si(OR^2)_3$; or, a raw material for forming the electron barrier film includes the compound with the general formula $R^1$—$Si(OR^2)_3$; where $R^2$ is selected from one in a group consisting of H, $CH_3$, and $C_2H_5$; $R^1$ is selected from $(CH_2)_nX$, n is an integer between 3 and 6, a functional group X is selected from a group consisting of —$P(OR^3)_2$, —$P(R^3)_2$, —SH, —$NH_2$, —COOH; $R^3$ is $(CH_2)_mCH_3$, and m is an integer between 1 and 7.

In the second aspect, a quantum dot light-emitting diode is provided, the quantum dot light-emitting diode includes: an anode and a cathode arranged to be opposite to each other; a quantum dot luminescent layer arranged between the anode and the cathode; the aforesaid electron barrier film for the quantum dot light-emitting diode, where the electron barrier film is arranged between the quantum dot luminescent layer and the cathode or arranged between the quantum dot luminescent layer and the anode.

In the third aspect, a method for preparing a quantum dot light-emitting diode is provided, this method includes a following step of:

depositing a compound with a general formula $R^1$—$Si(OR^2)_3$ between a quantum dot luminescent layer and a cathode to form an electron barrier film.

Where, $R^2$ is selected from one in a group consisting of H, $CH_3$, and $C_2H_5$; $R^1$ is selected from $(CH_2)_nX$, where n is an integer between 3 and 6; X is selected from a group consisting of —$P(OR^3)_2$, —$P(R^3)_2$, —SH, —$NH_2$ and —COOH; $R^3$ is $(CH_2)_mCH_3$, where m is an integer between 1 and 7.

In the fourth aspect, a method for preparing a quantum dot light-emitting diode is provided, this method includes a following step of:

depositing a compound with a general formula $R^1$—$Si(OR^2)_3$ between a quantum dot luminescent layer and an anode to form an electron barrier film.

Where, $R^2$ is selected from one in a group consisting of H, $CH_3$, and $C_2H_5$; $R^1$ is selected from $(CH_2)_nX$, where n is an integer between 3 and 6; X is selected from a group consisting of —$P(OR^3)_2$, —$P(R^3)_2$, —SH, —$NH_2$ and —COOH; $R^3$ is $(CH_2)_mCH_3$, where m is an integer between 1 and 7.

The electron barrier film for the quantum dot light-emitting diode according to the embodiment of the present application has the beneficial effects as follows: the electron barrier film for the quantum dot light-emitting diode includes a compound with a general formula $R^1$—$Si(OR^2)_3$; or the raw material for forming the electron barrier film includes a compound with the general formula $R^1$—$Si(OR^2)_3$; where an organic functional group $R^1$ can react with a dangling bond on a quantum dot surface of the quantum dot luminescent layer, so that a silane coupling agent can be coordinated to the quantum dot surface, and can further generate coupling reaction and coordination reaction with ligands such as hydroxyl, amino and carboxyl on the quantum dot surface, and the quantum dot can be coupled with the silane coupling agent more tightly through chemical reaction, the interface layer is compact, the stability of electron transmission and the stability of the device are improved; $R^2$ is selected from one in a group consisting of H, $CH_3$ and $C_2H_5$, and siloxy $Si(OR^2)_3$ which contains $R^2$ can generate the coupling reaction with other functional layer. The electron barrier film of the present application can not only adjust the rate of injecting electrons into the luminescent layer to enable the number of the electron holes in the quantum dot luminescent layer to be equal to the number of the electrons in the quantum dot luminescent layer, thereby improving the recombination efficiency of the electrons and the electron holes in the luminescent layer, but also achieve a better interface modification effect and reduce a surface roughness of the quantum dot luminescent layer, thereby making an overall performance of the quantum dot light-emitting diode to be more stable.

The quantum dot light-emitting diode according to the embodiments of the present application has the beneficial effects as follows: the quantum dot light-emitting diode includes: an anode and a cathode arranged to be opposite to each other, a quantum dot luminescent layer arranged between the anode and the cathode, an electron barrier film arranged between the quantum dot luminescent layer and the cathode or arranged between the quantum dot luminescent layer and the anode; the electron barrier film includes a compound with a general formula $R^1$—$Si(OR^2)_3$, where an organic functional group $R^1$ can react with a dangling bond on a quantum dot surface in the quantum dot luminescent layer, so that a silane coupling agent can be coordinated to the quantum dot surface, and can further generate coupling reaction with ligands such as hydroxyl, amino, carboxyl on the quantum dot surface, the quantum dot can be coupled with the silane coupling agent more tightly through chemical reaction, the interface layer is compact, the stability of electron transmission and the stability of the device are improved; $R^2$ is selected from one in a group consisting of H, $CH_3$ and $C_2H_5$, and the siloxy which is expressed by $Si(OR^2)_3$ and contains $R^2$ can generate coupling reaction with inorganic metal materials of the cathode. An electron barrier film is formed between the quantum dot luminescent layer and the cathode or the anode according to the reaction between the electron barrier film and other functional layers such as the anode or the cathode in the quantum dot luminescent layer. In one aspect, the silane coupling agent in the electron barrier film has an insulating property, so that the number of electrons injected into the luminescent layer can be reduced to a certain extent, the number of electron holes is enabled to be equal to the number of electrons, integration of a huge number of electronic components into the device is alleviated, so that the excitons may generate radiative jump, and auger recombination is reduced; in another aspect, the silane coupling agent in the electron barrier film may generate a good interface modification effect, not only the coupling between the quantum dot luminescent layer and the cathode is tighter, surface roughness of the quantum dot luminescent layer is also reduced, the surface is spread uniformly and is smoother, and the overall performance of the QLED is more stable; in one another aspect, the silane coupling agent in the electron barrier film may also adsorb a small amount of water vapor, and thereby absorbs moisture absorbed by the device later to reduce the damage of the water vapor to QLED device, so that the overall performance of the QLED device is more stable, and the service life of the QLED device is prolonged.

The method for preparing the quantum dot light-emitting diode according to the embodiments of the present application has the beneficial effects as follows: the method includes the steps of depositing a compound with the general formula $R^1$—$Si(OR^2)_3$ between the quantum dot luminescent layer and the cathode or the anode to form an electron barrier film, where the electron barrier film takes at least one compound $R^1$—$Si(OR^2)_3$ as a raw material, $R^2$ is selected from one in a group consisting of H, $CH_3$ and $C_2H_5$, and $R_1$ is selected from $(CH_2)_nX$, n is an integer between 3 and 6, X is selected from one in a group consisting of —$P(OR^3)_2$, —$P(R^3)_2$, —SH, —$NH_2$, —COOH, $R^3$ is $(CH_2)_mCH_3$, m is an integer between 1 and 7, the electron barrier film is formed by generating coupling reaction between the compound in the electron barrier film and the functional layer of the adjacent quantum dot luminescent layer or the cathode, or the anode. According to the preparation method of the present invention, the electron barrier film is firmly bonded between the quantum dot luminescent layer and the cathode or the anode through a chemical reaction such as coupling reaction and coordination reaction, and this method is prone to be performed and is applicable for mass production and industrial application; moreover, the recombination efficiency of the electrons and the electron holes in the prepared QLED is high, and the prepared QLED has a good luminescent property.

BRIEF DESCRIPTION OF DRAWINGS

In order to describe the embodiments of the present application more clearly, a brief introduction regarding the accompanying drawings that need to be used for describing the embodiments or exemplary technology is given below; it is obvious that the accompanying drawings described below are merely some embodiments of the present application, a person of ordinary skill in the art may also acquire other drawings according to the current drawings without paying creative labor.

FIG. 2 is a schematic structural diagram of a QLED according to embodiment two of the present application;

FIG. 3 is a schematic flowchart of one QLED preparation method according to one embodiment of the present application; and FIG. 4 is a schematic flowchart of another QLED preparation method according to one embodiment of the present application.

DESCRIPTION OF EMBODIMENTS

Figure 1:
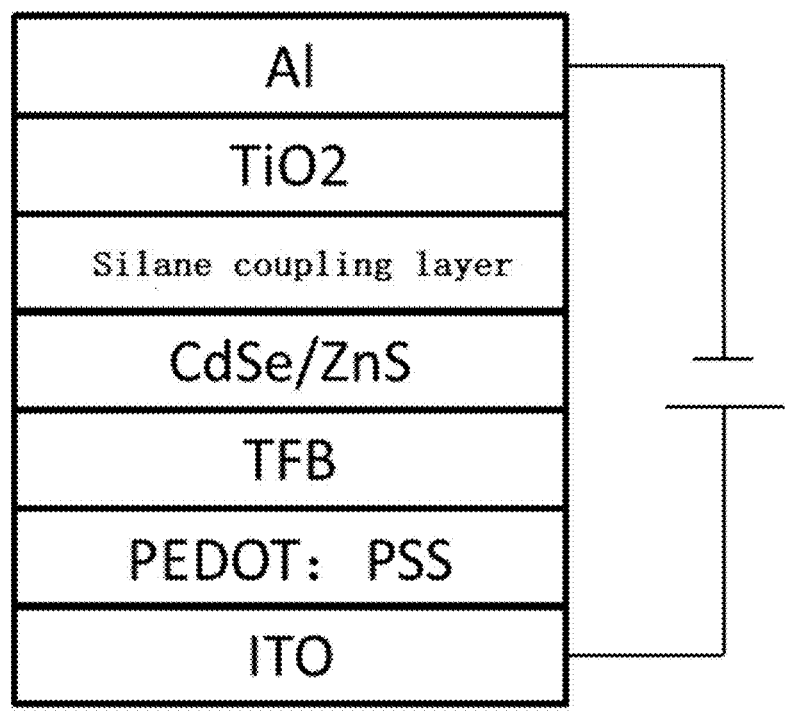
FIG. 1 is a schematic structural diagram of a QLED according to embodiment one of the present application.

In order to make the objective, the technical solutions and the technical effects of the present application be clearer, the technical solutions in the embodiments of the present application will be described clearly and comprehensively. It is obvious that, the embodiments described below are only some embodiments of the present application, rather than all of the embodiments. All other embodiments which are obtained by a person of ordinary skill in the art with reference to the embodiments in the present application without paying creative labor, should all be included in the protection scope of the present application.

In the descriptions of the present application, it should be understood that, terms such as "the first" and "the second" are only used for the purpose of illustration, and thus should not be considered as indicating or implying any relative importance, or implicitly indicating the number of indicated technical features. Thus, technical feature(s) restricted by "the first" or "the second" can explicitly or implicitly comprise one or more such technical feature(s). In the description of the present application, "a plurality of" has the meaning of at least two, unless there is additional explicit and specific limitation.

The weights of relevant components mentioned in the description of the embodiments of the present application can not only refer to the specific contents of the various components, but also represent a proportional relationship of the weights of the various components. Thus, as long as the contents of related components according to the embodiments of this application are increased or decreased in proportion, the increased or decreased contents are still included in the scope of the disclosure of the present application. In particular, the weight described in the description of the embodiments of the present application may be a mass unit such as μg, Mg, G, and Kg well known in the chemical industry.

An electron barrier film for a quantum dot light-emitting diode is provided in the embodiments of the present application, the electron barrier film includes a compound with a general formula $R^1$—$Si(OR^2)_3$; as an alternative, a raw material for forming the electron barrier film include compounds of the general formula $R^1$—$Si(OR^2)_3$; where $R^2$ is selected from one in a group consisting of H, $CH_3$, $C_2H_5$, $R^1$ is selected from $(CH_2)_nX$, n is an integer between 3 and 6, X is selected from one in a group consisting of —$P(OR^3)_2$, —$P(R^3)_2$, —SH, —$NH_2$, —COOH, $R^3$ is $(CH_2)_mCH_3$, m is an integer between 1 and 7.

An electron barrier film for a QLED (Quantum Dot Light Emitting Diode) according to one embodiment of this application includes a compound with a general formula $R^1$—$Si(OR^2)_3$; as an alternative, a raw material for forming the electron barrier film includes the compound with the general formula $R^1$—$Si(OR^2)_3$; where an organic functional group R1 may react with a dangling bond on a quantum dot surface of the quantum dot luminescent layer, so that the silane coupling agent can not only be coordinated to the quantum dot surface, but also generate coupling reaction and coordination reaction with ligands such as hydroxyl, amino, carboxyl on the quantum dot surface, the quantum dots can be bonded with the silane coupling agent tightly through chemical reaction, the interface layer is compact, both the stability of electron transmission and the stability of a device (i.e., the QLED) are improved; $R^2$ is selected from one in a group consisting of H, $CH_3$ and $C_2H_5$, and siloxy which has the general formula $Si(OR_2)^3$ and contains $R^2$ may react with other functional layers. The electron barrier film according to this embodiment of the present application can not only adjust the rate of injecting electrons into the luminescent layer to enable the number of electron holes in the quantum dot luminescent layer to be equal to the number of electrons in the quantum dot luminescent layer and improve the recombination efficiency of electrons and electron holes in the luminescent layer, but also achieve a better interface modification effect and reduce a surface roughness of the quantum dot luminescent layer, thereby enabling an overall performance of the QLED to be more stable.

In particular, the electron barrier film which contains the compound with the general formula $R^1$—$Si(OR^2)_3$ according to the embodiment of the present application can not only adjust the transmission rate and the transmission stability of electrons according to the compound $R^1$—$Si(OR^2)_3$ with an insulating property in the barrier layer, but also adjust the transmission rate of electrons through a coupling product which is generated by bonding the compound with the general formula $R^1$—$Si(OR^2)_3$ with the quantum dot luminescent layer and other functional layers in the barrier layer. Adjustments of transmission rate and transmission stability of electrons are achieved according to the compound with the general formula $R^1$—$Si(OR^2)_3$ in the electron barrier film and the reaction between the compound with the general formula $R^1$—$Si(OR^2)_3$ and the adjacent functional layer after polymerization, the consistency between the number of electron holes and the number of electrons in the quantum dot luminescent layer is better guaranteed, and the recombination efficiency of electrons and electron holes in the luminescent layer is improved.

In some embodiments, the electron barrier film includes a compound with the general formula $R^1$—$Si(OR^2)_3$; where $R^2$ is selected from one in a group consisting of H, $CH_3$, $C_2H_5$, $R^1$ is selected from $(CH_2)_nX$, n is 3 or 4, X is selected from one in a group consisting of —$P(OR_3)2$, —$P(R_3)2$, —SH, —NH2, —COOH, R3 is $(CH_2)_mCH_3$, and m is an integer between 2 and 5. In these embodiments of the present application, when the numbers of selected methylene groups in the groups $R^1$ and $R^3$ of the electron barrier film are different, the lengths of the flexible chain segments are also different, and the strengths of interactions between the silane coupling agents and the ligands of the quantum dots are also different; with the increasing of values of N and M, the lengths of the flexible chain segments are increased, an interaction effect of the quantum dots and the silane coupling agents is enhanced; when the solubility of the silane coupling agent is fixed, the thickness of the silane coupling agent may also be increased, and an electron blocking capability is enhanced. In the compound $R^1$—$Si(OR^2)_3$ of the electron barrier film according to this embodiment of the present application, n is an integer being equaling to 3 or 4, m is an integer between 2 and 5, a branched chain with this length enables the electron barrier film, so that a strength of reaction between the compound of the barrier layer and ligands of the quantum dot and other functional layers is guaranteed, and the formed electron barrier film has a moderate barrier effect on the electrons, rather than making a serious barrier effect on the electrons to reduce the recombination efficiency of the electrons and the electron holes.

Since a sequence of strengths of non-metallic natures of elements C, N, P and S is N, S, P, and C, thus, when X in the group $R^1$ of the compound $R^1$—$Si(OR^2)_3$ of the electron barrier film is selected from a group consisting of —$P(OR^3)_2$, —$P(R^3)_2$, —SH, —NH2, —COOH and other different groups, the sequence of strengths of coordination and reaction of groups between the group X in the group $R^1$ and the quantum dot is —NH$_2$, —SH, —$P(OR^3)_2$, —$P(R^3)_2$, —COOH. Therefore, binding forces of groups between the compound $R^1$—$Si(OR^2)_3$ of the electron barrier film and the quantum dot surface is —NH2, —SH, —$P(OR^3)_2$, —$P(R^3)_2$, —COOH. In some embodiments, the electron barrier film includes a compound with a general formula $NH_2(CH_2)_n$—$Si(OR^2)_3$, where $R^2$ is selected from one in a group consisting of H, $CH_3$ and $C_2H_5$, and n is 3 or 4. The electron barrier film for the quantum dot light-emitting diode in this embodiment of the present application is bonded with the quantum dot layer tightly, and the stability of the device is better.

In some embodiments, the electron barrier film includes γ-mercaptopropyl trimethoxysilane. In some embodiments, the electron barrier film includes 3-aminopropyl triethoxysilane. In some embodiments, the electron barrier film includes γ-mercaptopropyl trimethoxysilane and 3-aminopropyl triethoxysilane. The electron barrier film according to this embodiment of the present application includes γ-mercaptopropyl trimethoxysilane or 3-aminopropyl triethoxysilane; as an alternative, the electron barrier film includes the γ-mercaptopropyl trimethoxysilane and the 3-aminopropyl triethoxysilane, so that the obtained electron barrier film is enabled to be tightly bonded with the quantum dot luminescent layer and other functional layers, the compactness of the interface layer of the device is improved, the stability of electron transmission and the stability of the device are improved accordingly.

In some embodiments, the thickness of the electron barrier film is between 2 nm and 30 nm. The electron barrier film with the thickness between 2 nm and 30 nm in the QLED in this embodiment of the present application has an optimal adjustment effect on the injection rate of electrons, the matching numbers for the electrons and the electron holes injected into the quantum dot luminescent layer is optimal, and the recombination efficiency for the electrons and the electron holes is the highest. If the thickness of the electron barrier film is too thin, the adjustment effect of the electron injection rate is not obvious; if the thickness of the electron barrier film is too thick, there is an excessive blocking effect on the electrons, such that the number of electrons is less than the number of electron holes in the quantum dot luminescent layer, and the luminous efficiency of the QLED is reduced. In some embodiments, the material of the electron barrier film is selected from a group consisting of γ-mercaptopropyl trimethoxysilane, 3-aminopropyl triethoxysilane; and the electron barrier film has a thickness between 2 nm to 30 nm.

Correspondingly, a QLED (Quantum Dot Light Emitting Diode) is provided in one embodiment of the present application, the QLED includes: an anode and a cathode arranged to be opposite to each other;
  a quantum dot luminescent layer arranged between the anode and the cathode;
  the electron barrier film for the QLED, where the electron barrier film is arranged between the quantum dot luminescent layer and the cathode, or the electron barrier film is arranged between the quantum dot luminescent layer and the anode.

The QLED provided by this embodiment of the present application includes an anode and a cathode arranged to be opposite to each other, the quantum dot luminescent layer arranged between the anode and the cathode, and the electron barrier film arranged between the quantum dot luminescent layer and the cathode or the anode; where the electron barrier film includes the compound with the general formula $R^1$—$Si(OR^2)_3$, the organic functional group $R^1$ can not only react with a dangling bond of the quantum dot surface in the quantum dot luminescent layer to enable the silane coupling agent to be coordinated to the quantum dot surface, but also generate coupling reaction and coordination reaction with ligands such as hydroxyl, amino and carboxyl on the quantum dot surface, so that the quantum dot can be bonded with the silane coupling agent tightly through chemical reaction, the interface layer is compact, the stability of electron transmission and the stability of the device are improved; $R^2$ is selected from one in a group consisting of H, $CH_3$ and $C_2H_5$, and the siloxy $Si(OR^2)_3$ which contains $R^2$ can generate coupling reaction with the metal material of the cathode. According to the reaction between the electron barrier film and other functional layers such as the anode or the cathode in the quantum dot luminescent layer, an electron barrier film is formed between the quantum dot luminescent layer and the cathode or the anode. In one aspect, the silane coupling agent in the electron barrier film has an insulating property, so that the number of electrons injected into the luminescent layer can be reduced to a certain extent, and the number of electron holes is enabled to be equal to the number of electrons, so that integration of a huge number of electronic components into the device is alleviated, the excitons may generate radiative jump, and auger recombination is reduced; in another aspect, the silane coupling agent in the electron barrier film may realize a good interface modification effect, not only the bonding between the quantum dot luminescent layer and the cathode is tighter, the surface roughness of the quantum dot luminescent layer is also reduced, the surface is spread uniformly and is smoother, and the overall performance of the quantum dot light-emitting diode is more stable; in one another aspect, the silane coupling agent in the electron barrier film may also adsorb a small amount of water vapor, and may absorb moisture absorbed by the device later to reduce the damage of the water vapor to the quantum dot light-emitting diode device accordingly, so that the overall performance of the device is more stable, and the service life is prolonged.

In particular, the electron barrier film which contains the compound with the general formula $R^1$—$Si(OR^2)_3$ according to this embodiment of the present application can not only adjust the transmission rate and transmission stability of electrons through the compound $R^1$—$Si(OR^2)_3$ with insulating property in the barrier layer, but also adjust the transmission rate of electrons through the coupling polymer generated after the compound $R^1$—$Si(OR^2)_3$ in the barrier layer is bonded with the quantum dot luminescent layer and other functional layers. According to the present application, the adjustment of electron transmission rate and the adjustment of stability of electron transmission are realized through the compound $R^1$—$Si(OR^2)_3$ in the electron barrier film and the reaction between the compound $R^1$—$Si(OR^2)_3$ and the adjacent functional layer after polymerization, the consistency between the number of electron holes and the number of electrons in the quantum dot luminescent layer is better guaranteed, and the recombination efficiency of electrons and electron holes in the luminescent layer is improved.

In some embodiments, the electron barrier film includes a compound with the general formula $R^1$—$Si(OR^2)_3$; where $R^2$ is selected from one in a group consisting of H, $CH_3$, $C_2H_5$, $R^1$ is selected from $(CH_2)_nX$, n is 3 or 4, X is selected from one in a group consisting of —$P(OR_3)_2$, —$P(R_3)2$, —SH, —NH2, —COOH, R3 is $(CH_2)_mCH_3$, and m is an integer between 2 and 5. In these embodiments of the present application, when the numbers of selected methylene groups in the groups $R^1$ and $R^3$ of the electron barrier film are different, the lengths of the flexible chain segments are also different, such that the strengths of reactions between the silane coupling agents and the ligands of the quantum dots are also different; with the increasing of values of N and M, the lengths of the flexible chain segments are increased, the reaction effects of the quantum dots and the silane coupling agents is enhanced; when the solubility of the silane coupling agent is fixed, the thickness of the silane coupling agent will be also increased, and an electron blocking capability is enhanced. In the compound $R^1$—Si$(OR^2)_3$ of the electron barrier film according to this embodiment of the present application, n is an integer being equaling to 3 or 4, m is an integer between 2 and 5, the branched chain with this length enables the electron barrier film, so that the strength of reaction between the compound of the barrier layer and ligands of the quantum dot and other functional layers is ensured, and the formed electron barrier film has a moderate barrier effect on the electrons, rather than making a serious barrier effect on the electrons to reduce the recombination efficiency of the electrons and the electron holes.

Since a sequence of strengths of non-metallic natures of elements C, N, P and S is N, S, P, and C, thus, when X in the group $R^1$ of the compound $R^1$—Si$(OR^2)_3$ of the electron barrier film is selected from a group consisting of —P$(OR^3)_2$, —P$(R^3)_2$, —SH, —NH2, —COOH and other different groups, the sequence of strengths of coordination and reaction of groups between the group X in the group $R^1$ and the quantum dot is —NH$_2$, —SH, —P$(OR^3)_2$, —P$(R^3)_2$, —COOH. Therefore, binding forces of groups between the compound $R^1$—Si$(OR^2)_3$ of the electron barrier film and the quantum dot surface is —NH2, —SH, —P$(OR^3)_2$, —P$(R^3)_2$, —COOH. In some embodiments, the electron barrier film includes a compound with the general formula NH$_2$(CH$_2$)n-Si$(OR^2)_3$, where $R^2$ is selected from one in a group consisting of H, CH$_3$ and C$_2$H$_5$, and n is 3 or 4. The electron barrier film for the quantum dot light-emitting diode in this embodiment of the present application is bonded with the quantum dot layer tightly, and the stability of the device is better.

In some embodiments, the electron barrier film includes at least one of γ-mercaptopropyl trimethoxysilane and 3-aminopropyl triethoxysilane; as an alternative, a raw material for forming the electron barrier film includes at least one of the γ-mercaptopropyl trimethoxysilane and the 3-aminopropyl triethoxysilane. Both the γ-mercaptopropyl trimethoxysilane and the 3-aminopropyl triethoxysilane in the electron barrier film according to this embodiment of the present application can be bonded with the quantum dot luminescent layer and the cathode tightly, so that the compactness of the interface layer of the device is improved, the stability of electron transmission and the device stability are improved.

In some embodiments, the thickness of the electron barrier film is between 2 nm and 30 nm. The electron barrier film with the thickness between 2 nm and 30 nm in the QLED in this embodiment of the present application has the optimal adjustment effect on the injection rate of electrons, matched numbers of the electrons and the electron holes injected into the quantum dot luminescent layer is optimal, and the recombination efficiency for the electrons and the electron holes is the highest. If the thickness of the electron barrier film is too thin, the adjustment effect of the electron injection rate is not obvious; if the thickness of the electron barrier film is too thick, there is an excessive blocking effect on the electrons, so that the number of electrons is less than the number of electron holes in the quantum dot luminescent layer, and the luminous efficiency of the quantum dot light-emitting diode is reduced.

In some embodiments, the material of the quantum dot luminescent layer is selected from at least one of semiconductor compounds in groups II-IV, groups II-VI, groups II-V, groups III-V, groups IV-VI, groups II-IV-VI, groups II-IV-V in the periodic table of elements, or be core-shell structure semiconductor compound composed of at least two of the aforesaid semiconductor compounds, where the semiconductor compound from the Group II-IV refers to a semiconductor compound consisting of elements in the group II and the elements in the group IV; other semiconductor compounds are based on the same rationale described above. In some embodiments, the material of the quantum dot luminescent layer is selected from at least one semiconductor nanocrystal compound of a group consisting of CdSe, CdS, CdTe, ZnO, ZnSe, ZnS, ZnTe, HGS, HgSe, HgTe, CdZnSe, or be a gradient hybrid type, or a core-shell structure type, or a combined type of semiconductor nanocrystal compound constituted of at least two aforesaid semiconductor nanocrystal compounds. In other embodiments, the quantum dot material is selected from at least one semiconductor nanocrystal compound of the group consisting of InAs, InP, InN, GaN, InSb, InAsP, InGaAs, GaAs, GaP, GaSb, AlP, AlN, AlAs, AlSb, CdSeTe, ZnCdSe, or be a hybrid type, or a gradient hybrid type, or a core-shell structure type, or a combined type of semiconductor nanocrystal compound constituted of at least two aforesaid semiconductor nanocrystal compounds. The quantum dot materials have the characteristics of quantum dots and good photoelectric properties. The material of the quantum dot luminescent layer according to this embodiment of the present application may be any type of semiconductor quantum dot material, as long as this material can generate coupling reaction and coordination reaction with the organic functional group in the silane coupling agent in the electron barrier film to enable the electron barrier film to be well bonded on the surface of one side of the quantum dot luminescent layer, and achieve the effect of adjustment of the injection rate and the interface modification of the electrons.

In some embodiments, the material of the quantum dot luminescent layer is selected from at least one in a group consisting of a perovskite nanoparticle material (in particular, a luminescent perovskite nanoparticle material), a metal nanoparticle material, and a metal oxide nanoparticle material. These quantum dot materials have the characteristics of quantum dots and have good photoelectric properties.

In some embodiments, the material surface of the quantum dot luminescent layer is bonded with a ligand, and the ligand is selected from at least one in a group consisting of an acid ligand, a thiol ligand, an amine ligand, a phosphine oxide ligand, a phosphine ligand, a phospholipid, a soft phospholipid, and a polyvinyl pyridine. The surface of the material of the quantum dot luminescent layer according to this embodiment of the present application is bonded with at least one of the acid ligand, the thiol ligand, the amine ligand, the phosphine oxide ligand, the phosphine ligand, the phospholipid, the soft phospholipid and the polyvinyl pyridine, these ligands can not only improve the coordination and coupling effect of the silane coupling agent and the quantum dot in the electron barrier film to enable the electron barrier film to be more stably bonded on the quantum dot surface luminescent layer, but also modify the interface of the quantum dot luminescent layer, so that the roughness of the surface of the luminescent layer is reduced, the tightness of connection between the luminescent layer and other functional layers is improved, and the stability of the QLED is improved.

In some embodiments, the acid ligand is selected from at least one of a group consisting of a capric acid, an undecenoic acid, a tetradecanoic acid, an oleic acid and a stearic acid. In some other embodiments, the thiol ligand is selected from at least one in a group consisting of an octadecancthiol, a dodecyl mercaptan and an octadecyl mercaptan. In some other embodiments, the amine ligand is selected from at least one in a group consisting of an oleamine, an octadecylamine, and an octamine. In some other embodiments, the phosphine ligand is selected from a trioctylphosphine. In some other embodiments, the phosphine oxide ligand is selected from a trioctylphosphine oxide. In this embodiment of the present application, the ligands and the silane coupling agent in the electron barrier film have a better coupling reaction and coordination reaction effect.

In some embodiments, the quantum dot material in the quantum dot luminescent layer has a particle size between 1 nm and 20 nm. In some embodiments, the quantum dot material may be any type of quantum dot material such as a hybrid type, a gradient hybrid type, a core-shell structure type, or a combined type of quantum dot material. In some embodiments, the quantum dot material may be an oil-soluble quantum dot material, or be a self-doped or non-doped quantum dot material. According to this embodiment of the present application, the type and the structure of the quantum dots in the quantum dot luminescent layer are not limited, the corresponding quantum dot material may be selected according to the requirement of specific application, as long as the selected quantum dot material can generate coupling reaction and coordination reaction with the organic functional groups in the silane coupling agent in the electron barrier film to enable the electron barrier film to be better bonded on the surface of one side of the quantum dot luminescent layer, thereby realizing the effect of adjustment of the injection rate of the electrons and modification of interface.

In some embodiments, the QLED further includes an electron transport layer arranged between the electron barrier film and the cathode, and a hole transport layer arranged between the quantum dot luminescent layer and the anode. In some embodiments, the electron transport layer includes a metal oxide. In some specific embodiments, the electron transport layer includes the metal oxide selected from at least one in a group consisting of ZnO, ZnMgO, ZnMgLiO, ZnInO, $TiO_2$, $ZrO_2$, $Alq_3$, TAZ, TPBI, PBD, BCP, Bphen, and $HfO_2$. In the electron transport layer containing the metal oxide according to the embodiments of the present application, the metal oxide in the electron transport layer can not only transmit electrons released from the cathode better, but also generate coupling reaction with the silane coupling agent in the electron barrier film, so that the electron barrier film can be bonded between the electron transport layer and the quantum dot luminescent layer, the silane coupling agent with insulating property reduces the rate of injecting electrons into the quantum dot luminescent layer to a certain extent, so that the number of electron holes is enabled to be equal to the number of electrons in the quantum dot luminescent layer, integration of a huge number of components in the device is alleviated; thus, excitons can generate radiative jumps and auger recombination is reduced. Moreover, the electron barrier film is bonded with the electron transport layer and the quantum dot luminescent layer by the silane coupling agent according to coupling reaction and coordination reaction, and can achieve the effect of interface modification, so that the quantum dot luminescent layer is tightly connected with the electron transport layer, the roughness of the quantum dot surface luminescent layer is reduced, and the electron transport layer is uniformly spread and is smooth, and the stability of the device (i.e., the QLED) is improved accordingly.

In some embodiments, the quantum dot light-emitting diode further includes a hole transport layer arranged between the quantum dot luminescent layer and the anode and a hole injection layer arranged between the hole transport layer and the anode. The QLED according to this embodiment of the present application further includes the hole transport layer arranged between the quantum dot luminescent layer and the anode and the hole injection layer arranged between the hole transport layer and the anode, so that the injection efficiency of electron holes is improved through the hole injection layer and the hole transport layer, so that equaling of the number of electrons holes and the number of electrons in the quantum dot luminescent layer is further guaranteed, the recombination efficiency of electrons and electron holes in the quantum dot luminescent layer is improved, and the luminescence efficiency of the device is improved accordingly.

In some embodiments, the QLED according to the embodiment is classified into a QLED with a non-inverted structure and a QLED with an inverted structure.

In one embodiment, the QLED having the non-inverted structure includes a laminated structure of an anode and a cathode arranged to be opposite to each other, a quantum dot luminescent layer arranged between the anode and the cathode, and the anode is arranged on the substrate. In some embodiments, a hole functional layer such as a hole injection layer and a hole transport layer may be arranged between the anode and the quantum dot luminescent layer; an electron functional layer such as an electron transport layer, an electron injection layer, and an electron barrier film may also be arranged between the cathode and the quantum dot luminescent layer. In some embodiments of the device (i.e., the QLED) with the non-inverted structure, the QLED includes a substrate, an anode arranged on the surface of the substrate, a hole injection layer arranged on the surface of the substrate, a hole transport layer arranged on the surface of the hole injection layer, a quantum dot luminescent layer arranged on the surface of the hole transport layer, an electron barrier film arranged on the quantum dot surface luminescent layer, an electron transport layer arranged on the surface of the electron barrier film, and a cathode arranged on the surface of the electron transport layer.

In one embodiment, the QLED with the non-inverted structure includes the laminated structure of the anode and the cathode arranged to be opposite to each other, the quantum dot luminescent layer arranged between the anode and the cathode, and the cathode is arranged on the substrate. In some embodiments, the electron hole functional layer such as the hole injection layer and the hole transport layer may be arranged between the anode and the quantum dot luminescent layer; the electron functional layer such as the electron transport layer, the electron injection layer and the electron barrier film may also be arranged between the cathode and the quantum dot luminescent layer. In some embodiments, the QLED includes the substrate, the cathode arranged on the surface of the substrate, the electron transport layer arranged on the surface of the substrate, the electron barrier film arranged on the surface of the electron transport layer, the quantum dot luminescent layer arranged on the surface of the electron barrier film, the hole transport layer arranged on the quantum dot surface luminescent layer, the hole injection layer arranged on the surface of the hole transport layer, and the anode arranged on the surface of the hole injection layer.

In some embodiments, the substrate layer includes a rigid substrate, a flexible substrate, or the like.

The anode includes ITO (Indium Tin Oxide), FTO (Fluorine Doped Tin Oxide), and ZTO (Zinc Tin Oxide), and the like.

The hole injection layer includes PEODT, PSS (poly (3, 4-ethylene dioxythiophene), poly (styrene sulfonic acid)), $WoO_3$, $MoO_3$, NiO, $V_2O_5$, HATCN (2, 3, 6, 7, 10, 11-hexacyano-1,4,5,8,9,12-hexaazatriphenylene), CuS, and the like.

The hole transport layer may be a micromolecule organic matter or be a polymer conductive polymer, including: TFB (poly [(9, 9-di-n-octyl fluorenyl-2, 7-diyl)-alt-(4, 4'-(N-(4-n-butyl) phenyl)-diphenylamine)]), PVK (polyvinyl carbazole), TCTA (4, 4', 4"-(carbazole-9-yl) triphenylamine), TAPC (4, 4'-cyclohexyl [N, N-(4-methylphenyl) diphenylamine]), Poly-TBP, Poly-TPD, NPB (N, N'-diphenyl-N, N'-(1-naphthyl)-1, biphenyl-4, 4'-diamidogen), CBP (4,4'-(9-carbazole) biphenyl), PEODT: PSS, $MoO_3$, $WoO_3$, NiO, CuO, $V_2O_5$, CuS, and the like.

The quantum dot luminescent layer includes at least one or a compound of at least two selected from a group consisting of CdSe, CdS, CdTe, ZnO, ZnSe, ZnS, ZnTe, HgS, HgSe, HgTe, CdZnSe, or includes at least one or a compound of at least two selected from a group consisting of InAs, InP, InN, GaN, InSb, InAsP, InGaAs, GaAs, GaP, GaSb, AlP, AN, AlAs, AlSb, CdSeTe, ZnCdSe.

The electron barrier film includes a compound with the general formula $R^1$—$Si(OR^2)_3$, where $R^2$ is selected from one in a group consisting of H, $CH_3$, and $C_2H_5$, and $R^1$ is selected from $(CH_2)_nX$, n is an integer between 3 and 6, X is selected from one in a group consisting of —$P(OR^3)_2$, —$P(R^3)_2$, —SH, —NH2 and —COOH, and $R^3$ is $(CH_2)_mCH_3$, m is an integer between 1 and 7.

The electron transport layer includes one or more selected from a group consisting of ZnO, ZnMgO, ZnMgLiO, ZnInO, TiO2, ZrO2, Alq3, TAZ (3-(biphenyl-4-yl)-5-(4-tert-butylphenyl)-4-phenyl-4H-1, 2, 4-triazole), TPBI (1, 3, 5-(1-phenyl-1H-benzimidazole-2-yl) trityl), PBD (2-(4'-tert-butylphenyl)-5-(4'-biphenyl)-1, 3, 4-oxadiazole), BCP (2, 9-dimethyl-4, 7-diphenyl-1, 10-phenanthroline), Bphen (4, 7-diphenyl-1, 10-phenanthroline), $HfO_2$.

The cathode includes Al, Ag, Au, Cu, Mo, or alloys of these elements.

The QLED according to the embodiments of the present application may be prepared according to the method listed below.

In some embodiments, as shown in FIG. 3, a method for preparing a QLED (Quantum Dot Light Emitting Diode) is further provided in one embodiment of the present application, this method including the following steps:

At step S10, a compound with the general formula $R^1$—$Si(OR^2)_3$ is deposited between a quantum dot luminescent layer and a cathode to form an electron barrier film;

where $R^2$ is selected from one in a group consisting of H, $CH_3$ and $C_2H_5$, $R^1$ is selected from $(CH_2)_nX$, n is an integer between 3 and 6, a functional group X is selected from one in a group consisting of —$P(OR^3)_2$, —$P(R^3)_2$, —SH, —NH2 and —COOH, and $R^3$ is $(CH_2)_mCH_3$, and m is an integer between 1 and 7.

In some embodiments, as shown in FIG. 4, another method for preparing a QLED is further provided in one embodiment of the present application, this method includes the steps listed below:

A compound with a general formula $R^1$—$Si(OR^2)_3$ is deposited between a quantum dot luminescent layer and an anode to form an electron barrier film;

where $R^2$ is selected from one in a group consisting of H, $CH_3$ and $C_2H_5$, $R^1$ is selected from $(CH_2)_nX$, n is an integer between 3 and 6, X is selected from one in a group consisting of —$P(OR^3)_2$, —$P(R^3)_2$, —SH, —NH2 and —COOH, and $R^3$ is $(CH_2)_mCH_3$, and m is an integer between 1 and 7.

The QLED preparation method according to this embodiment of the present application includes the following steps of: depositing the compound with the general formula $R^1$—$Si(OR^2)_3$ between the quantum dot luminescent layer and the cathode or the anode to form the electron barrier film, where $R^2$ is selected from one in a group consisting of H, $CH_3$ and $C_2H_5$, $R^1$ is selected from $(CH_2)_nX$, n is an integer between 3 and 6, X is selected from one in a group consisting of —$P(OR^3)_2$, —$P(R^3)_2$, —SH, —NH2 and —COOH, and $R^3$ is $(CH_2)_mCH_3$, and m is an integer between 1 and 7; the electron barrier film is formed by coupling reaction and coordination reaction between the compound in the electron barrier film and the adjacent quantum dot luminescent layer and the cathode or anode. According to the preparation method of the present application, the electron barrier film is firmly bonded between the quantum dot luminescent layer and the cathode or the anode through a chemical reaction such as coupling reaction and coordination reaction, and this method is prone to be performed and is applicable for mass production and industrial application; furthermore, there is a high recombination efficiency for the electrons and the electron holes in the prepared QLED, and the prepared QLED has excellent luminescence property.

In some embodiments, the step of depositing the compound with the general formula $R^1$—$Si(OR^2)_3$ between the quantum dot luminescent layer and the cathode to form the electron barrier film includes: depositing the compound with the general formula $R^1$—$Si(OR^2)_3$ on the surface of one side of the quantum dot luminescent layer away from the anode, and then depositing the electron transport layer or the cathode on the compound with the general formula $R^1$—$Si(OR^2)_3$, thereby forming the electron barrier film between the quantum dot luminescent layer and the electron transport layer or between the quantum dot luminescent layer and the cathode. According to this embodiment of the present application, the electron barrier film material is spin-coated or printed onto the quantum dot surface luminescent layer, such that the organic group $R^1$ of the silane coupling agent with the general formula of $R^1$—$Si(OR^2)_3$ in the electron barrier film can generate coupling and coordination reaction sufficiently with ligands such as Hydroxyl, amino and carboxyl on quantum dot surface of the quantum dot luminescent layer and the dangling bond on the quantum dot surface luminescent layer, so that the silane coupling agent can be firmly bonded to the quantum dot surface luminescent layer, and the subsequent coupling and bonding between the cathode and the silane coupling agent in the electron barrier film is facilitated; in this situation, the electron barrier film does not need to be dried completely through such as assisted high-temperature drying, the electron barrier film only needs to be dried and formed to facilitate subsequent deposition of the electron transport layer or the cathode. In some embodiments, after the material of the electron barrier film is spin-coated on the surface of one side of the quantum dot luminescent layer away from the anode, after the reaction is sufficiently performed for such as 20-60 minutes, the material is volatilized and dried for 30 minutes under $1\times10^{-6}$ Torr to obtain the electron barrier film. In some embodiments, the material of the electron barrier film is printed on the surface of one side of the quantum dot luminescent layer away from the anode, after the reaction is sufficiently performed for such as 20-60 minutes, the material is volatilized and dried for 30 minutes under vacuum of $1\times10^{-6}$ Torr to obtain the electron barrier film. In some embodiments, the material of the electron barrier film is spin-coated and printed on the surface of one side of the quantum dot luminescent layer away from the anode, after the reaction is sufficiently performed for such as 20-60 minutes, the material is volatilized and dried for 30 minutes under vacuum of $1\times10^{-6}$ Torr to form the electron barrier film.

In some embodiments, a sputtering manner is used to directly deposit a cathode metal material on a surface of one side of the electron barrier film away from the quantum dot luminescent layer to form a cathode, the cathode metal material is activated to a certain extent during the sputtering and deposition process, the surface of the activated metal material is provided with an active functional group such as hydroxyl group, so that a coupling reaction between the cathode and the compound in the electron barrier film can be facilitated, and the electron barrier film can be better bonded between the quantum dot luminescent layer and the cathode.

In some embodiments, a step of depositing a material of the electron transport layer on the surface of the electron barrier film away from the quantum dot luminescent layer to form the electron transport layer first includes: spin-coating the material of the electron transport layer on the surface of the electron barrier film to generate reaction, and drying the material to obtain the electron transport layer. In some embodiments, depositing the electron transport layer on the surface of the electron barrier film away from the quantum dot luminescent layer first to form the electron transport layer includes: printing the material of the electron transport layer on the surface of the electron barrier film, and drying the material to obtain the electron transport layer. In some embodiments, forming the electron transport layer on the surface of one side of the electron barrier film away from the quantum dot luminescent layer by deposition includes: spin-coating and printing the material of the electron transport layer on the surface of the electron barrier film, and drying the material to obtain the electron transport layer. According to this embodiment of the present application, the material of the electron transport layer is formed on the surface of the electron barrier film according to a method such as spin-coating or printing, so that the organic group $R^1$ and the siloxy group $Si(OR^2)_3$ of the silane coupling agent in the electron barrier film can be fully coupled and boned with the material of the electron transport layer, then, the electron barrier film and the electron transport layer are sequentially laminated on the surface of one side of the quantum dot luminescent layer away from the anode. In some embodiments, the material of the electron transport layer is spin-coated on the surface of the electron barrier film, after the reaction is performed sufficiently for such as 20-60 minutes, and the material is volatilized and dried for 30-60 minutes at a temperature of 80-200° C. and under vacuum of $1\times10^{-6}$ Torr to form the electron transport layer. In some embodiments, the material of the electron transport layer is printed on the surface of the electron barrier film, after the reaction is performed for such as 20-60 minutes, and the material is volatilized and dried for 30-60 minutes at the temperature of 80-200° C. and under vacuum of $1\times10^{-6}$ Torr to form the electron transport layer. In some embodiments, the material of the electron transport layer is spin-coated and printed on the surface of the electron barrier film, after the reaction is performed for such as 20-60 minutes, and the material is volatilized and dried for 30-60 minutes at the temperature of 80-200° C. and under vacuum of $1\times10^{-6}$ Torr to form the electron transport layer.

In some embodiments, the step of depositing the compound with the general formula $R^1$—$Si(OR^2)_3$ between the quantum dot luminescent layer and the cathode to form the electron barrier film includes: depositing the compound with the general formula $R^1$—$Si(OR^2)_3$ on the surface of the cathode away from a substrate or depositing the compound with the general formula $R^1$—$Si(OR^2)_3$ on the surface of the electron transport layer away from the cathode, and then depositing the quantum dot luminescent layer on the compound with the general formula $R^1$—$Si(OR^2)_3$, thereby forming the electron barrier film between the cathode and the quantum dot luminescent layer or between the electron transport layer and the quantum dot luminescent layer. A step of forming the electron barrier film on the surface of the cathode by deposition includes: pre-performing a plasma activation treatment on the surface of the cathode to provide the surface of the cathode with an active functional group such as the hydroxyl group, and then depositing the material of the electron barrier film on the surface of the cathode by spin-coating or printing, such that the silane coupling agent in the electron barrier film can be fully coupled with and bonded to the active functional group on the surface of the cathode, this reaction lasts for such as 20-60 minutes, then, the material is volatilized and dried for 30 minutes under vacuum of $1\times10^{-6}$ Torr, so that the electron barrier film is formed on the surface of the cathode.

In some embodiments, the QLED preparation method further includes: providing a substrate with a cathode, forming an electron transport layer on the surface of the cathode by deposition; forming an electron barrier film on the surface of the electron transport layer away from the cathode by deposition; forming a quantum dot luminescent layer on the surface of the electron barrier film away from the electron transport layer by deposition; forming a hole transport layer on the quantum dot surface luminescent layer away from the electron barrier film by deposition. The step of forming the electron barrier film on the surface of the electron transport layer away from the cathode by deposition includes: spin-coating, printing or spin-coating and printing the material of the electron barrier film on the surface of the electron transport layer away from the cathode, after the reaction is performed, and the material is dried, the electron barrier film is obtained. The material of the electron barrier film is formed on the surface of one side of the electron transport layer away from the cathode according to a method such as spin-coating, printing, etc., so that the silane coupling agent in the electron barrier film is sufficiently coupled and bonded with the material of the electron transport layer.

In some embodiments, after the electron transport layer is spin-coated, printed or spin-coated and printed on the surface of the electron transport layer away from the cathode, after the reaction is sufficiently performed for such as 20-60 minutes, the material is volatilized and dried for 30 minutes under vacuum of $1\times10^{-6}$ Torr, so that the electron barrier film is formed. The step of depositing the quantum dot luminescent layer on the surface of the electron barrier film away from the electron transport layer includes: spin-coating, printing or spin-coating and printing the material of the quantum dot luminescent layer on the surface of the electron barrier film, and forming the quantum dot luminescent layer after reacting and drying the material of the quantum dot luminescent layer. According to this embodiment of the present application, the material of the quantum dot luminescent layer is spin-coated, printed or spin-coated and printed on the surface of the electron barrier film, so that the silane coupling agent can generate coupling reaction and coordination reaction with ligands such as Hydroxyl, amino, carboxyl on the quantum dot surface of the quantum dot luminescent layer, then, the quantum dot luminescent layer is formed by drying. In some embodiments, after the material of the quantum dot luminescent layer is spin-coated, printed or spin-coated and printed on the surface of the electron barrier film, after the reaction is performed for such as 20-60 minutes, the material is volatilized and dried for 30-60 minutes at a temperature of 80° C.-200° C. and under vacuum of $1\times10^{-6}$ Torr, so that the quantum dot luminescent layer is formed.

In some embodiments, the step of depositing the quantum dot luminescent layer on the surface of the anode away from the substrate further includes: forming the hole injection layer on the surface of the anode away from the substrate by deposition and forming a hole transport layer on a surface of the hole injection layer away from the anode by deposition, and forming the quantum dot luminescent layer on a surface of the hole transport layer away from the hole injection layer by deposition.

In order to make the implementation details and the principle of the present application to be interpreted by the person of ordinary skill in the art, and to make the progressiveness of the QLED and the preparation method of the QLED in the embodiments of the present application to be significantly revealed, the technical solutions are illustrated by way of examples according to a plurality of embodiments.

Embodiment One

A QLED (Quantum Dot Light Emitting Diode) is provided in this embodiment, the structure of the QLED is shown in FIG. 1, this QLED includes: a substrate (which includes a first electrode ITO) and a hole injection layer (PEODT: PSS) laminated on the substrate, a hole transport layer (i.e., TFB) laminated on the surface of the hole injection layer, a quantum dot luminescent layer laminated on the surface of the hole transport layer, a silane coupling layer laminated on the quantum dot surface luminescent layer, an electron transport layer laminated on the surface of the silane coupling layer, and a second electrode (i.e., Al) arranged on the electron transport layer; where the material of the silane coupling layer is 3-mercaptopropyl triethoxysilane.

Where the preparation process of the electron barrier film and the electron transport layer includes: configuring the 3-mercaptopropyl triethoxysilane as a solution, spin-coating or printing the solution on the quantum dot luminescent layer, after the reaction lasts for 30 minutes, the reaction is stopped, and volatilization and drying the quantum dot luminescent layer under vacuum of $1\times10^{-6}$ Torr for 30 minutes to prepare the silane coupling layer; then, spin-coating or printing a tetraisopropyl titanate isopropanol solution on silane coupling layer material, stopping reaction after reacting for 20 minutes, heating up the silane coupling layer material to a temperature of 100° C., volatilizing and drying the silane coupling layer material for 30 minutes under vacuum of $1\times10^{-6}$ Torr, thereby forming the electron transport layer $TiO_2$.

Embodiment Two

A QLED (Quantum Dot Light Emitting Diode) is provided in this embodiment, the structure of the QLED is shown in FIG. 2, the QLED includes a substrate (which includes a first electrode ITO) and an electron transport layer (i.e., TFB) laminated on the substrate, a silane coupling layer laminated on the surface of the electron transport layer, a quantum dot luminescent layer (i.e., CdSe/ZnSe/ZnS) laminated on the surface of the silane coupling layer, a hole transport layer (i.e., TFB) laminated on the quantum dot surface luminescent layer, a hole injection layer (i.e., LiF) laminated on the surface of the hole transport layer, and a second electrode (i.e., Al) arranged on the hole injection layer; where the silane coupling layer material is 3-aminopropyl triethoxysilane.

Where the preparation process of the electron barrier film and the quantum dot luminescent layer includes: configuring the 3-aminopropyl triethoxysilane as a solution, spin-coating or printing the solution on the electron transport layer, stopping reaction after reacting for 20 minutes, and volatilizing and drying the electron transport layer for 30 minutes under vacuum of $1\times10^{-6}$ Torr to form the silane coupling layer; then, spin-coating or printing quantum dot luminescent layer solution on silane coupling layer material, stopping reaction after reacting for 20 minutes, heating up the silane coupling layer material to 120° C., volatilizing and drying the silane coupling layer material for 30 minutes under vacuum of $1\times10^{-6}$ Torr to form the quantum dot luminescent layer.

Reference Example One

A QLED (Quantum Dot Light Emitting Diode) is provided in the reference example one, this QLED includes a substrate (i.e., the substrate includes a first electrode ITO) and a hole injection layer (i.e., PEB) laminated on the substrate, a hole transport layer (i.e., TFB) laminated on a surface of the hole injection layer, a quantum dot luminescent layer (i.e., CdSe/ZnS) laminated on a surface of the hole transport layer, an electron transport layer (i.e., $TiO_2$) laminated on a quantum dot surface luminescent layer, and a second electrode (i.e., Al) arranged on the electron transport layer.

In the embodiments of the present application, in order to verify the progressiveness of the QLED according to the embodiments of the present application, photoelectric property tests are performed on the quantum dot light-emitting diodes in the embodiment one, the embodiment two and the reference example one, test results are shown in table one below:

TABLE ONE

| Item of test | Embodiment one | Embodiment two | Reference example one |
|---|---|---|---|
| External Quantum Efficiency (EQE)/(%) | 13.8 | 12.6 | 8.3 |

It can be seen from the test results that, the external quantum efficiency of the QLED provided in embodiment one and embodiment two of the present application is significantly higher than that of the QLED in the reference example one, and the luminescent property of the QLED provided in embodiment one and embodiment two of the present application is better.

The foregoing embodiments are only preferable embodiments of the present application, and should not be regarded as limitations to the present application. All modifications, equivalent replacements, and improvements, which are made within the spirit and the principle of the present application, should all be included in the protection scope of the present application.

What is claimed is:

1. A quantum dot light-emitting diode, comprising:
an anode and a cathode arranged to be opposite to each other;
a quantum dot luminescent layer arranged between the anode and the cathode; and
an electron barrier film, wherein the electron barrier film comprises a compound with a general formula $R^1$—Si$(OR^2)_3$, or a raw material for forming the electron barrier film comprises the compound with the general formula $R^1$—Si$(OR^2)_3$; wherein the electron barrier film is arranged between the quantum dot luminescent layer and the cathode or arranged between the quantum dot luminescent layer and the anode;
a functional group X in the compound with the general formula $R^1$—Si$(OR^2)_3$ is used for generating a coupling reaction with a ligand on a surface of a functional layer in the quantum dot light-emitting diode; and
wherein the ligand on the quantum dot surface luminescent layer is selected from at least one in a group consisting of an acid ligand, a thiol ligand, an amine ligand, a phosphine oxide ligand, a phosphine ligand, a phospholipid, a soft phospholipid, and a polyvinyl pyridine.

2. The quantum dot light-emitting diode according to claim 1, wherein the electron barrier film is arranged between the quantum dot luminescent layer and the cathode, and the quantum dot light-emitting diode further comprises:
an electron transport layer arranged between the electron barrier film and the cathode;
wherein the functional group X in the compound $R^1$—Si$(OR^2)_3$ is used for generating the coupling reaction with a ligand on a surface of the electron transport layer, and the ligand on the surface of the electron transport layer is selected from at least one in a group consisting of a hydroxyl group, an amino group and a carboxyl group.

3. The quantum dot light-emitting diode according to claim 2, wherein the acid ligand is selected from at least one in a group consisting of a capric acid, an undecenoic acid, a tetradecanoic acid, an oleic acid and a stearic acid.

4. The quantum dot light-emitting diode according to claim 2, wherein the thiol ligand is selected from at least one in a group consisting of an octadecancthiol, a dodecyl mercaptan and an octadecyl mercaptan.

5. The quantum dot light-emitting diode according to claim 2, wherein the amine ligand is selected from at least one in a group consisting of an oleamine, an octadecylamine, and an octamine.

6. The quantum dot light-emitting diode according to claim 2, wherein the phosphine ligand is selected from a trioctylphosphine, and the phosphine oxide ligand is selected from a trioctylphosphine oxide.

7. The quantum dot light-emitting diode according to claim 2, further comprising: a hole transport layer arranged between the quantum dot luminescent layer and the anode.

8. The quantum dot light-emitting diode according to claim 7, wherein the electron transport layer comprises a metal oxide.

9. The quantum dot light-emitting diode according to claim 8, wherein the metal oxide is selected from at least one in a group consisting of ZnO, ZnMgO, ZnMgLiO, ZnInO, $TiO_2$, $ZrO_2$, $AlQ_3$, TAZ, TPBI, PBD, BCP, Bphen, and $HfO_2$.

10. The quantum dot light-emitting diode according to claim 2, wherein $R^2$ is selected from one in a group consisting of H, $CH_3$, and $C_2H_5$;
$R^1$ is selected from $(CH_2)_nX$, n is an integer between 3 and 6, a functional group X is selected from a group consisting of —P$(OR^3)_2$, —P$(R^3)_2$, —SH, —$NH_2$, —COOH, $R^3$ is $(CH_2)_mCH_3$, and m is an integer between 1 and 7.

11. The quantum dot light-emitting diode according to claim 10, wherein n is 3 or 4; m is an integer between 2 and 5.

12. The quantum dot light-emitting diode according to claim 11, wherein the functional group X is —SH or —$NH_2$.

13. The quantum dot light-emitting diode according to claim 10, wherein the electron barrier film comprises at least one selected from a group consisting of a γ-mercaptopropyl trimethoxysilane and 3-aminopropyl triethoxysilane; or the raw material for forming the electron barrier film comprises at least one selected from a group consisting of the γ-mercaptopropyl trimethoxysilane and the 3-aminopropyl triethoxysilane.

14. The quantum dot light-emitting diode according to claim 10, wherein a thickness of the electron barrier film is between 2 mm and 30 nm.

* * * * *